Figure 1:
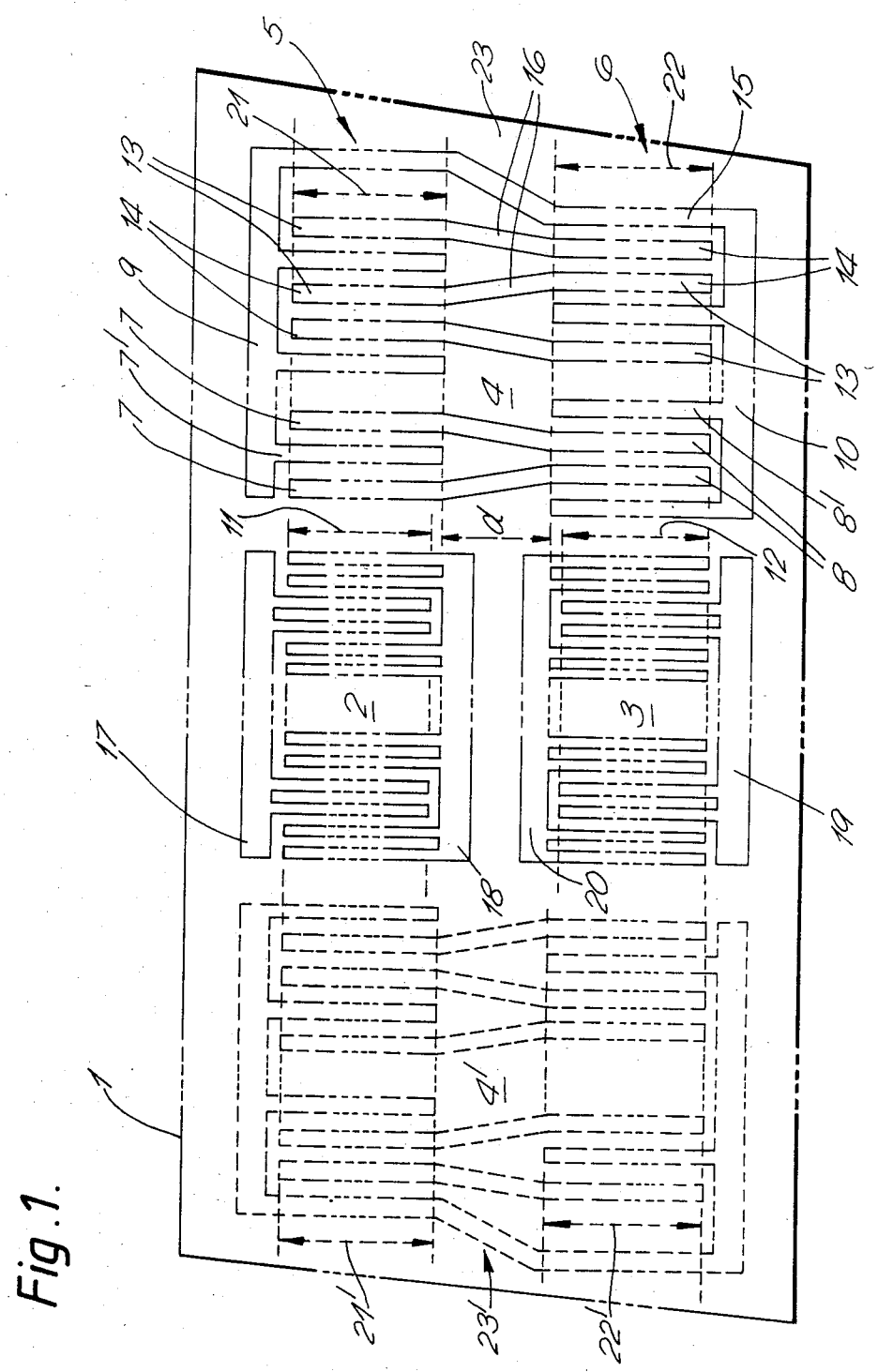

United States Patent [19]

Schofield

[11] Patent Number: 4,659,955
[45] Date of Patent: Apr. 21, 1987

[54] SURFACE-PROPAGATING ACOUSTIC WAVE DEVICE

[75] Inventor: John Schofield, Coulsdon, England

[73] Assignee: U.S. Philips Corporation, New York, N.Y.

[21] Appl. No.: 737,625

[22] Filed: May 24, 1985

[30] Foreign Application Priority Data

Jun. 15, 1984 [GB] United Kingdom ............... 8415353

[51] Int. Cl.$^4$ ............................................ H01L 41/08
[52] U.S. Cl. ................................. 310/313 D; 333/153; 333/195
[58] Field of Search .......... 310/313 R, 313 B, 313 C, 310/313 D; 333/150–155, 193–196

[56] References Cited

U.S. PATENT DOCUMENTS 4,155,056 5/1979 Cross et al. ......................... 333/195
4,350,963 9/1982 Iwamoto et al. ............... 333/153 X
4,567,453 1/1986 Schofield ................... 310/313 D X
4,591,818 5/1986 Schofield ......................... 333/153 X Primary Examiner—Mark O. Budo
Attorney, Agent, or Firm—Robert T. Mayer; Bernard Franzblau

[57] ABSTRACT

In a surface acoustic wave device which includes a relfective multistrip coupler (4, 4'), direct electrical breakthrough resulting from the adjacent location of the input and output transducers (2, 3) is reduced by including at least one forward multistrip coupler (24,25) in each path coupling the transducers (2,3) via the reflective couplers (4,4') so as to space the transducers (2,3) from one another. In a so-called low-loss device in which both ends of the transducers (2,3) are reflectively coupled, the arrangement enables the input/output track separation (23) of the reflective couplers to be reduced thereby significantly reducing the insertion loss of the device.

15 Claims, 8 Drawing Figures

SURFACE-PROPAGATING ACOUSTIC WAVE DEVICE

This invention relates to a surface-propagating acoustic wave bandpass electrical filter including a piezoelectric substrate able to propagate acoustic waves at a surface thereof, input transducing means arranged to launch acoustic wave energy along a propagation track at said surface, output transducing means arranged to receive acoustic wave energy from a further propagation track at said surface which is substantially parallel to but does not overlap said first track, and at least one electrical reflective multistrip coupling means arranged to receive acoustic wave energy from a corresponding end of the input transducing means and to relaunch at least part of that energy as acoustic wave energy back towards a corresponding end of the output transducing means, in which said input and output transducers are formed by respective interdigital electrode arrays each comprising parallel strip electrodes which are respectively connected to a corresponding one or other of a pair of bus bars extending along the corresponding sides of the interdigital electrode array, and in which the or each respective reflective coupling means comprises a first and second array of mutually parallel conducting strips arranged respectively across an input and an output propagation track, each array consisting of a first set of mutually insulated alternately widely and closely spaced strips, and a second set of electrically interconnected strips arranged so that at least one strip from the second set is situated between substantially every widely spaced pair of strips forming the first set, each strip forming a widely spaced pair in the first set of one array being respectively connected to a corresponding strip forming a closely spaced pair in the first set of the other array, and the second set of strips in both arrays being connected together. Such a device will be referred to herein as a surface propagating acoustic wave device of the kind specified.

A surface-propagating acoustic wave device employing a reflective multistrip coupler of the kind referred to, has been described in EP-A-No. 0098661. The process of track-changing is commonly employed in surface-propagating acoustic wave filters in order to reduce the transfer of energy from the launching to the receiving transducer by means of various bulk acoustic wave modes which are themselves also launched and received by the type of interdigital transducer normally employed, and which have propagation velocities which differ, in some cases only slightly, from the propagation velocity of the desired surface acoustic wave.

Hitherto, the form of forward transfer multistrip coupler disclosed for example in UK Patent Specification No. 1,372,235, has commonly been employed for track-changing, and, when suitably arranged, this form of coupler can transfer surface acoustic wave energy efficiently from one track to another. However, when a relatively narrow passband is required at relatively low frequencies, for example from about 10 MHz to 100 MHz, the need to accommodate the input and output transducers end to end, before and after the forward multistrip coupler, tends to make the substrate inconveniently long. Furthermore, although a conventional interdigital transducer will launch surface propagating acoustic wave energy equally in respective opposite directions from the two ends, a forward multistrip coupler can only conveniently couple one end of the launching (input) transducer to one end of the receiving (output) transducer, and acoustic energy launched from the other end of the launching transducer has to be absorbed or scattered and is therefore lost, thus increasing the insertion loss of the device. Such losses can sometimes be tolerated provided that the signal levels at which the device is to operate are high compared with circuit noise, as in the case of high level amplifiers. When, however, the device is to be employed, for example, in the early stages of a broadcast receiver, it is important to reduce the insertion loss as far as possible in order to provide a satisfactory signal-to-noise ratio. It can also be important to reduce losses in a diplexer filter for a transportable transceiver, for example for use in a cellular radio system, in order to reduce the size and consumption of the transmitter for a given effective radiated power.

The compact and potentially efficient form of reflective multistrip coupler described in the above mentioned EP-A-No. 0098661, provides a convenient means for coupling a corresponding end of adjacently disposed launching and receiving transducers thus forming a compact narrow bandwidth device at lower frequencies. The said reflective coupler also provides a convenient means for coupling each end of a launching transducer to a corresponding end of an associated receiving transducer to form an arrangement which enables surface acoustic wave energy launched from both ends of a launching transducer to be transferred to a receiving transducer, greatly reducing the insertion loss of the resultant device.

In such an arrangement, the launching and receiving transducers would have to be arranged side by side, which means that the input and output propagation tracks for acoustic energy received and relaunched by the reflective multistrip couplers, would need to be spaced apart by the sum of the widths of the adjacent bus bars of the two transducers and the spacing distance between the outer edges of said bus bars. However, the close proximity of the launching and receiving transducers increases the adverse effects of direct electrical signal break-through between the transducers.

Furthermore, losses tend to occur in the interconnection region of the reflective multistrip couplers because acoustic energy tends to be relaunched by interconnecting conductors present in that region which is outside the boundaries of the output track, and because of current losses along the length of the conductors interconnecting strips in the two arrays, and the magnitude of such losses is directly related to the spacing distance of the propagation tracks.

It is an object of the invention to provide an improved surface-propagating acoustic wave device in which some or all these difficulties can be reduced or minimised.

According to the invention there is provided a surface-propagating acoustic wave device of the kind specified, characterized in that at least one forward multistrip coupler is included in the or each surface acoustic wave propagation path which is arranged to couple corresponding ends of the input and output transducers via the respective said reflective multistrip couplers in a manner such that the input and output transducers are spaced apart transversely.

In one arrangement in accordance with the invention, a respective forward multistrip coupler is situated between the or each end of each transducer and the corresponding array track of the associated reflective multistrip coupler. Weighting can be applied to the transducer interdigital electrode arrays and/or to the forward multistrip couplers if desired. Embodiments of the invention will now be described by way of example, with reference to the accompanying drawings of which:

FIG. 1 illustrates a low-loss surface acoustic wave bandpass electrical filter device using reflective multistrip couplers as described in EP-A-No. 0098661.

Figure 2:
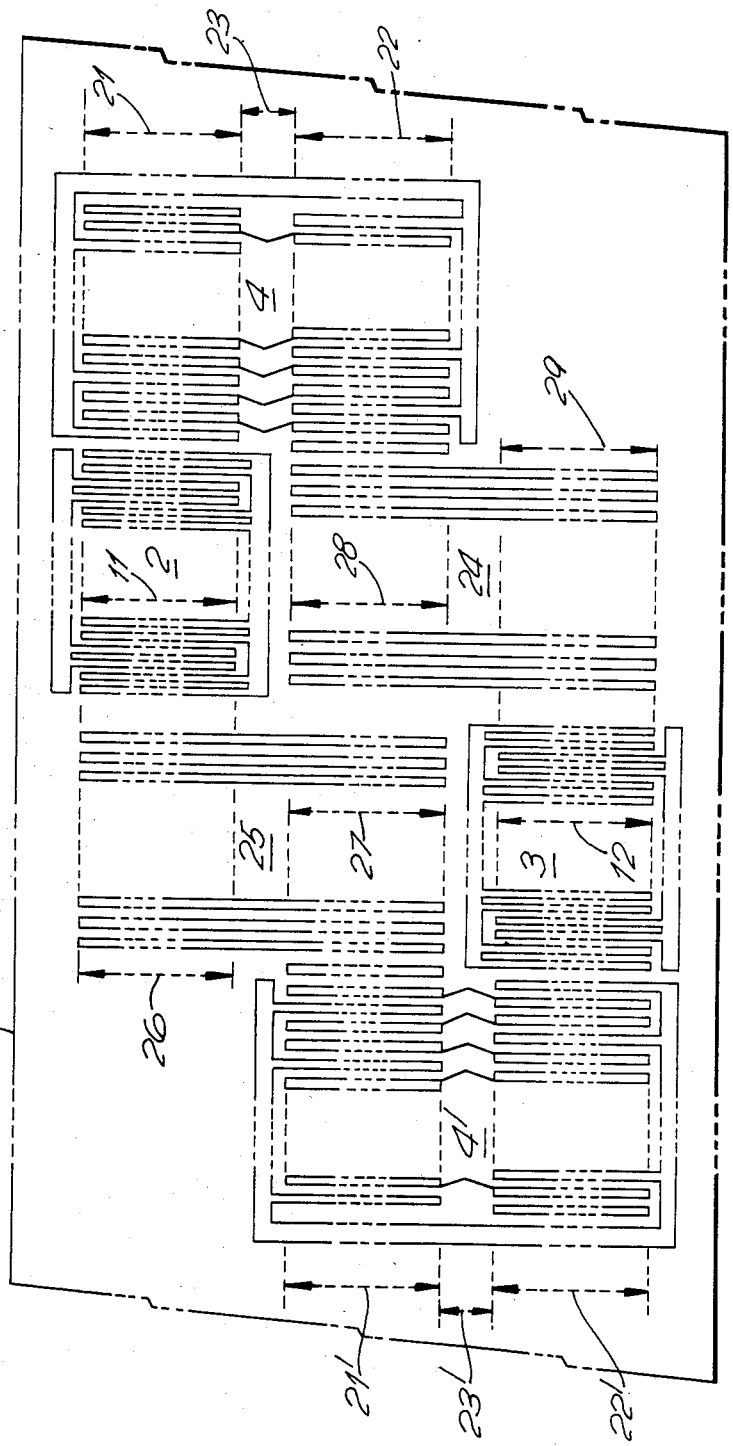
Figure 3:
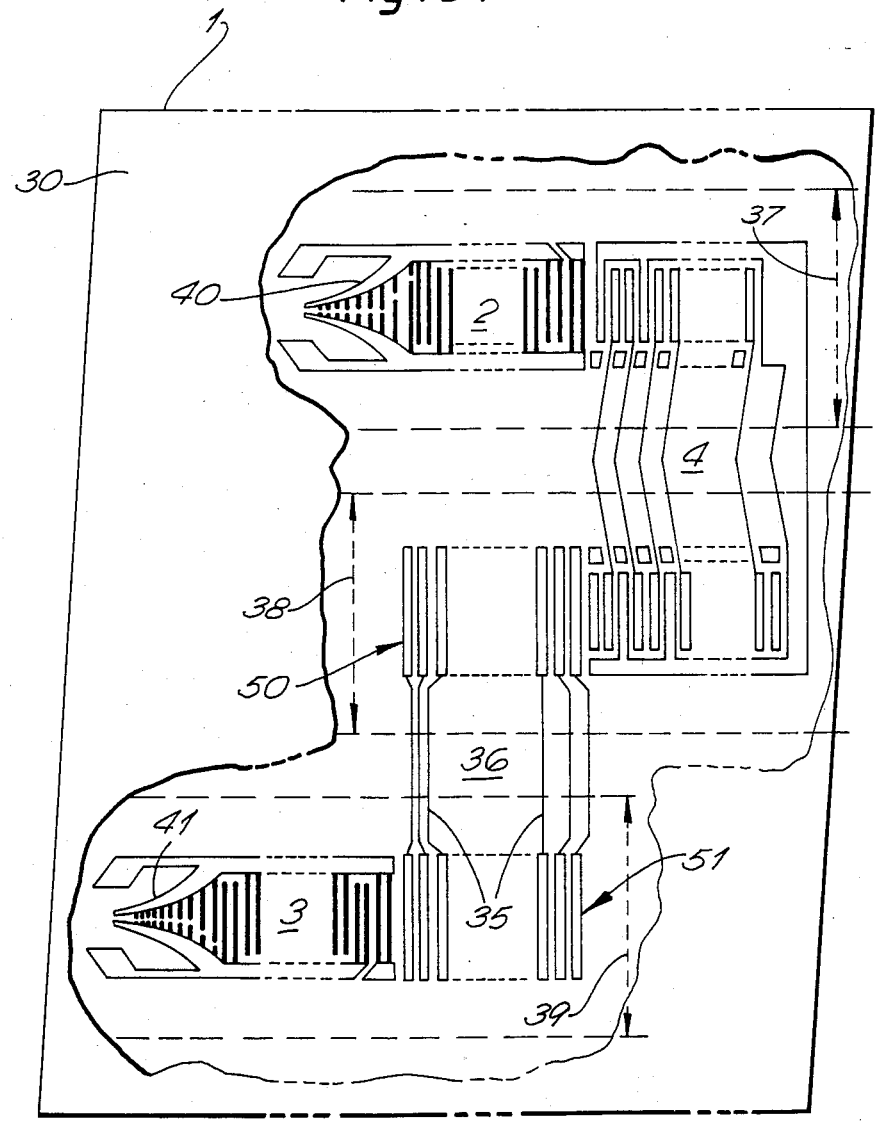
Figure 4:
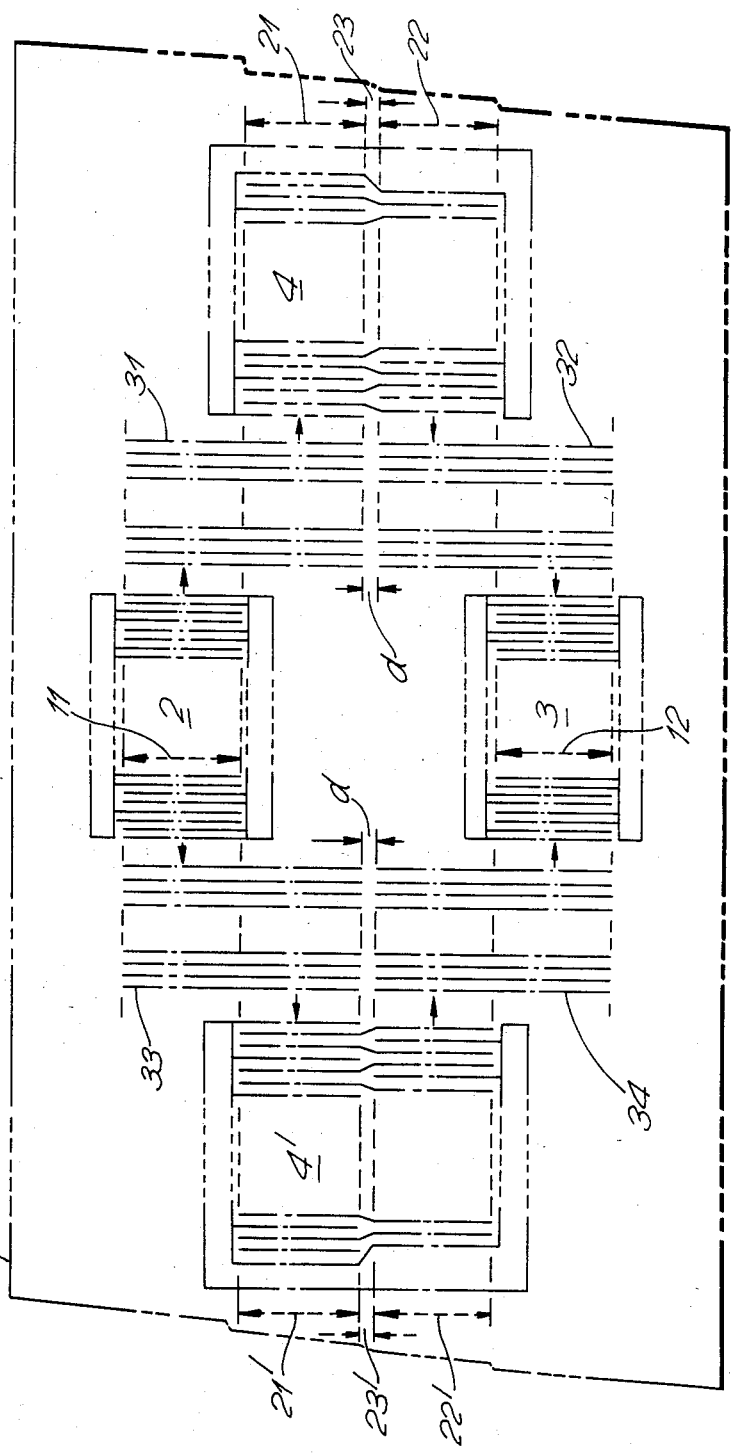
Figure 5:
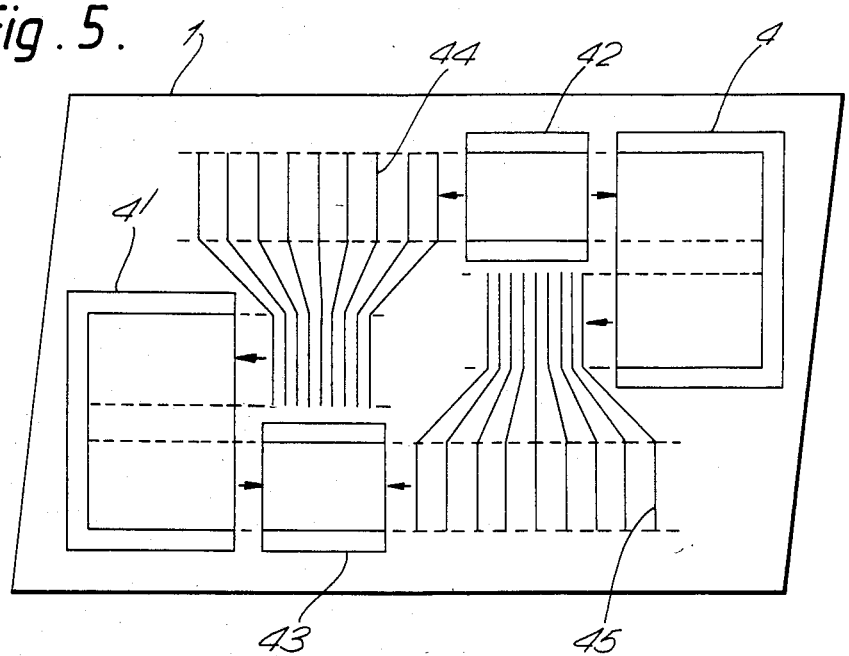
Figure 6B:
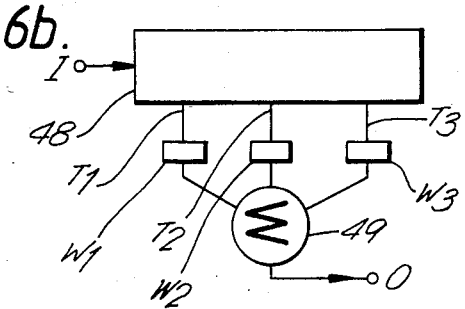
Figure 6A:
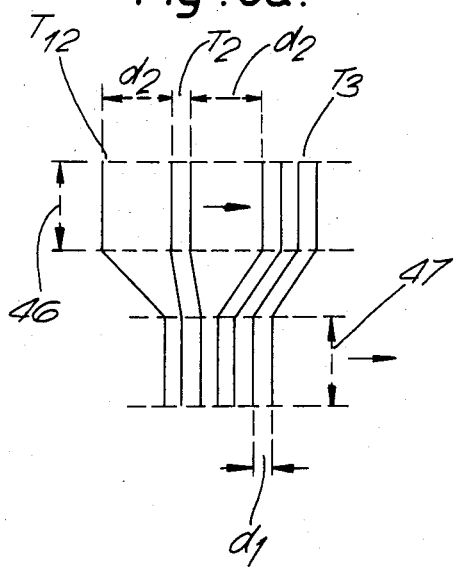
Figure 6C:
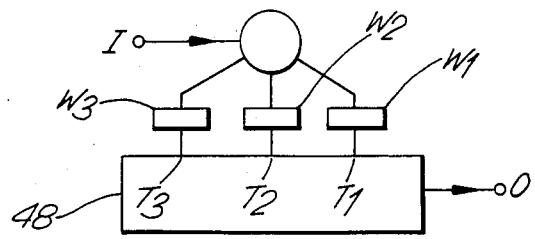

FIG. 2 shows a low-loss surface acoustic bandpass filter device in accordance with the invention, FIG. 3 shows a single-ended version of the device of FIG. 2, using the single-symmetrical guided propagation mode, FIG. 4 shows a further low-loss surface acoustic bandpass filter device in accordance with the invention, FIG. 5 shows a device as in FIG. 2, and employing weighting, and FIGS. 6a, 6b and 6c are diagrams illustrating the operation of the weighted-tap forward multistrip couplers.

Referring to the drawings, FIG. 1 shows a low-loss surface acoustic wave bandpass electrical filter device using reflective multistrip couplers of the kind described in EP-A-No. 0098661. A piezoelectric substrate 1 is provided with a major surface suitable for the propagation of surface acoustic waves. Input transducing means in the form of an interdigital electrode array 2 is arranged on said surface so as to launch acoustic wave energy along a first propagation track 11 at said surface. Output transducing means in the form of a further interdigital electrode array 3 is arranged on said surface adjacent to one side of the input transducing array 2, so as to receive acoustic wave energy from a second propagation track 12 at said surface, which is parallel to, but does not overlap the first track 11. Electrical reflective coupling means in the form of a reflective multistrip coupler 4 is arranged on said surface so as to receive acoustic wave energy from the input transducing array 2 via the first track 11 and to relaunch at least part of that energy as acoustic wave energy back towards the output transducing array 3 via the second track 12.

The reflective multistrip coupler 4 comprises a first array 5 of mutually parallel conducting strips 7, 7' arranged across an input propagation track 21, and a second array 6 of mutually parallel conducting strips 8, 8' arranged across an output propagation track 22. Each array 5, 6 consists of a respective first set of mutually insulated alternately widely and closely spaced strips 7, 8, and a second set of strips 7', 8', which are electrically interconnected by a peripheral bus-bar 9, 10. One of the strips 7', 8', of the second set is situated between each widely spaced pair 13 of the strips 7, 8, forming the first set of each array 5, 6. Each strip 7 forming a widely spaced pair 13 in the first set of one array, is respectively connected to a corresponding strip 8 forming a closely spaced pair 14 in the first set of the other array by means of a corresponding interconnecting strip 16. The bus bars 9, 10, interconnecting the strips 7', 8', forming the second sets of the respective arrays 5, 6, are connected together by an interconnecting bus bar portion 15. The strips 7,7', or 8,8', are uniformly spaced by λ/3 at the centre frequency of the passband.

The device illustrated in FIG. 1 is a wide aperture device meaning that the width of the acoustic aperture of the respective input and output transducers 2 and 3, represented by the maximum electrode overlap and equivalent to the width of the corresponding tracks 11 and 12, is greater than about 10 $\lambda_c$, and would normally lie in the range 20 $\lambda_c$ to 100 $\lambda_c$, where $\lambda_c$ is the acoustic wavelength at the centre frequency $f_c$ of the passband of the device. For this reason, the strip electrodes of the arrays making up the transducers 2, 3, and the reflective coupler 4, are shown as broken lines along part of their length indicating an overall length in the above range.

It should also be understood that only a few of the strip electrodes in each respective array are actually represented in the drawings for the sake of clarity. In practice, the length of the reflective coupler arrays 5, 6, is determined by that required to transfer as much energy as possible in the reflective direction from the input to the output tracks 21, 22, within the passband of the device. When using a typical Y-cut Z-propagating monocrystalline wafer of lithium niobate as the substrate 1, the length of each of the arrays 5, 6, would be about 100 $\lambda_c$, and the input and output transducers 2, 3, would each be of a similar length.

The device can be made into a so-called low-loss device by locating a second reflective multistrip coupler 4', shown in dashed outline, adjacent the other end of the input and output transducers 2, 3, so that acoustic energy is also correspondingly received from the input transducer 2 and relaunched so as to be received by the output transducer 3 in cooperating transductive relationship with the acoustic energy received from the coupler 4. In this way full use can be made of the surface acoustic wave energy launched by the input transducer 2 in both directions.

In either the single-ended or the double-ended coupling configuration, the close proximity of the input and output transducers 2, 3, can result in an undesirable amount of direct electrical coupling from the input to the output transducer in many applications. Furthermore, undesired losses can occur if the respective effective propagation tracks 11 and 12 of the corresponding transducers 2 and 3 are not exactly the same width as the input and output tracks 21, 21' and 22, 22' of the reflective coupler arrays 5,5' and 6, 6', and/or are not in exact register therewith. A further and significant source of energy loss is associated with the interconnecting conductor regions 23, 23', of the reflective multistrip couplers 4, 4', as a result of the undesired relaunching of acoustic energy by the interconnecting conductors 16 outside the boundaries of the transducer tracks 11, 12, and also as a result of resistive losses along the conductors 16 which it is desirable to make narrower than the electrodes 7, 8, in order to reduce relaunching and capacitive losses.

These losses which occur in the interconnecting region, are directly dependent on the distance d between the inner boundaries of the input and output propagation tracks 21, 21' and 22, 22' which must coincide with those of the respective propagation tracks 11 and 12 of the transducers 2 and 3. In order to reduce this distance the input and output transducers 2, 3, must be arranged very close to each other, and the distance d cannot be reduced below the sum of the widths of the adjacent bus bars 18 and 20 of the transducers. At this close proximity, a considerable amount of direct electrical signal breakthrough can occur between the input and output transducers 2 and 3.

FIG. 2 shows a low-loss surface acoustic wave bandpass electrical filter device in accordance with the invention in which components similar to those in FIG. 1 are indicated by the same reference numerals. The device comprises a piezoelectric substrate 1 on a major surface of which are provided respective input and output interdigital electrode transducer arrays 2, 3, and respective electrical reflective multistrip couplers 4,4', arranged to receive acoustic wave energy each from a corresponding end of the input transducer 2, and to relaunch at least part of that energy as acoustic wave energy back towards a corresponding end of the output transducer 3 in a co-operating transductive relationship.

In accordance with the present embodiment of the invention a forward multistrip coupler 24, 25, is provided in each of the propagation paths which couple corresponding ends of the input and output transducers 2, 3 via the respective reflective multistrip couplers 4, 4'. Thus in FIG. 2, while the right hand end of the input transducer 2 communicates directly with the input track 21 of the reflective multistrip coupler 4, the left hand end communicates with the input track 26 of the forward coupler 25 whose output track 27 communicates with the input track 21' of the reflective coupler 4'. The output track 22' of the reflective coupler 4' communicates directly with the propagation track 12 via the left hand end of the output transducer 3 which is thus displaced laterally relative to the input transducer 2 by a distance equal to the width of the input track 21' of the coupler 4' when compared with the arrangement shown in FIG. 1.

The output track 22 of the reflective coupler 4 communicates with the input track 28 of the forward multistrip coupler 24 whose output track 29 communicates with the propagation track 12 of the output transducer 3 via the right hand end thereof, and the device is set out so that the acoustic surface waves from the respective ends of the input transducer 2 arrive at the corresponding ends of the output transducer 3 in a co-operating signal transducing relationship with one another relative to the interdigital electrode array of the transducer 3.

In addition to the advantage of separating the input and output transducers 2, 3, by a significant distance and thereby substantially reducing the amount of direct electrical breakthrough therebetween, it will be apparent from FIG. 2 that the width d of the interconnection regions 23, 23', of the reflective multistrip couplers 4 and 4' can be reduced in the present embodiment to slightly greater than the width of the inner bus bar 18, 19, of the corresponding transducer 2, 3, because the forward multistrip couplers do not include bus bars at the edge boundaries.

The forward multistrip couplers 24, 25, can take the form of an array of electrically mutually insulated, spaced, parallel conducting strips spanning the input and output tracks thereof, for example as disclosed in British Patent specification G.B. Pat. No. 1,372,235.

FIG. 3 illustrates a single ended version of FIG. 2 in accordance with the invention, which can be employed in situations in which the signal greatly exceeds the circuit noise level and where insertion loss is not of primary concern, corresponding components having the same reference numerals. As is usual with single-ended operation, the non-communicating ends 40, 41, of the input and output transducers 2, 3, are arranged so that acoustic energy launched in the unwanted direction is not reflected along the desired propagation direction but is dispersed and attenuated, for example by shaping the bus bars and applying an attenuating medium 30, such as wax, to the surface of the substrate 1.

In the device shown in FIG. 3 the interdigital input and output transducer arrays 2, 3, are dimensioned transversely to the propagation direction and the electrode spacing adjusted so that they will only propagate and transduce a single surface-acoustic-wave guided-energy mode which is symmetrical about the central propagation axis of the array, as described in EP-A-No. 0106384. Thus, for example, when using the above mentioned cut of lithium niobate, the overall width of the transducers 2, 3, including the bus bars, is made approximately 3 $\lambda_c$.

It is a property of said single guided-energy mode that the propagating acoustic energy extends beyond the outer edges of the bus bars, and falls away exponentially, and this is indicated in FIG. 3 by the propagation tracks 37 and 39 which are effectively about twice the overall width of the transducer arrays. The input and output arrays of the reflective coupler 4 are also dimensioned so that the single symmetrical guided mode is propagated and transduced thereby. Reflected acoustic energy is relaunched via the track 38 towards the forward multistrip coupler 36 which is also arranged to maintain the guided mode of propagation by means of input and output strip electrode arrays 50 and 51 interconnected by thin interconnecting conductors 35. The conductors 35 are spaced in groups with alternately larger and smaller spacings than that required to cause the electrical signals generated by the input array 50 to launch acoustic waves in the region between the two arrays 50, 51, so as to minimise the amount of acoustic energy which is launched by the conductors 35 as undesired acoustic waves within the passband of the device and which would therefore contribute to the insertion loss of the device.

FIG. 4 shows a further embodiment of the invention in which the respective propagation paths which couple the respective corresponding ends of the input and output wide aperture transducers 2, 3, via the respective reflective multistrip couplers 4, 4', each include two forward multistrip couplers 31, 32 and 33, 34. Thus, in FIG. 3, the right hand end of the input transducer communicates with the input track of the multistrip coupler 31 whose output track communicates with the input track of the reflective multistrip coupler 4. The output track of the reflective coupler 4 launches acoustic energy into the input track of the multistrip coupler 32 whose output track communicates with the propagation track of the output transducer 3 via the right hand end. Acoustic energy launched by the input transducer via the left hand end thereof is similarly conveyed via the forward multistrip coupler 33, the reflective coupler 4' and the forward multistrip coupler 34 to the left hand end of the output transducer 3 so as to arrive in a co-operating transductive relationship with the acoustic energy conveyed via the first mentioned path.

Thus, relative to the device shown in FIG. 2, FIG. 4 illustrates a form of low-loss surface acoustic wave device in accordance with the invention in which a relatively small increase in the area of the substrate enables the input and output transducers 2, 3, to be separated by a distance equal to the combined widths of both tracks of a reflective coupler 4, 4', further reducing direct electrical breakthrough, while also enabling the width d of the interconnecting region 23, 23', of each reflective coupler 4, 4', to be further reduced to the smallest practicable amount.

As in the case of FIGS. 2 and 3, the device shown in FIG. 4 can be employed in the single-ended form at higher signal levels, if desired, and can employ the single symmetrical guided mode in which case the form of the forward multistrip coupler 36 shown in FIG. 3, may be employed for the couplers 31, 32, 33 and 34 in FIG. 4.

The input and output transducers 2 and 3, can comprise uniform interdigital electrode arrays, but it is usually desirable to employ some form of amplitude weighting. In a low-loss device it is preferable to employ withdrawal weighting in the transducer arrays because apodisation tends to lead to higher insertion loss for the device. However, withdrawal weighting of the transducers can only provide a limited amount of weighting on its own.

FIG. 5 illustrates diagrammatically a modification of the device shown in FIG. 2 in which weighting is also applied to the forward multistrip couplers employed to separate the input and output transducer tracks. The device is provided with withdrawal weighted input and output interdigital transducer arrays 42 and 43. In FIG. 5 the input transducer 42 communicates to the right with the input track of a reflective multistrip coupler 4, and to the left with the input track of a tap-weighted forward multistrip coupler 44 as described for example with reference to FIG. 3 of a paper entitled "SAW bandpass filter technique using a fanned multistrip coupler" by L. P. Solie, Applied Physics Letters Vol. 30, No. 8, 15th April, 1977. The output track of the weighted coupler 44 communicates with the input track of the reflective multistrip coupler 4' whose output track communicates with the propagation track of the withdrawal weighted output transducer 43 via the left hand end thereof. Correspondingly the output track of the reflective multistrip coupler 4 communicates via the input and output tracks of the weighted forward multistrip coupler 45 which is of similar construction to that of 44, with the right hand end of the propagation track of the withdrawal weighted output transducer 43.

FIGS. 6a and 6b illustrate the principle of the tap-weighted forward multistrip coupler 44. In FIG. 6a, acoustic surface wave energy propagating from left to right along the input track 46, encounters a strip electrode forming the first tap $T_1$ and piezoelectrically induces a potential therein which is conveyed via an interconnecting portion to a corresponding strip electrode in the output track 47 inducing an acoustic wave component to propagate therein. In the present example the first tap $T_1$ has a weight $W_1 = 1$ and is therefore formed by a single strip.

The wave in track 46 next encounters a first electrode of the second tap $T_2$ after travelling a distance $d_2 = \lambda_c + d_1$ where $d_2$ is the centre-to-centre distance between the next adjacent electrodes in successive taps and $d_1$ is the uniform centre-to-centre distance between electrodes in the second track 47, and induces a corresponding potential in the associated electrode in the output track 47. In the example, the second tap $T_2$ is allocated a weight $W_2 = 2$, consequently the tap is made up of two electrodes spaced by a distance $d_2$. Thus, the wave in track 46 next encounters the second electrode of tap $T_2$ and induces a potential in the associated strip electrode of the output track 47 at the same time as the disturbance induced in that track by the first electrode of the tap $T_2$ reaches that associated electrode and the two disturbances add together in the output track.

The wave in the input track 46 then travels a further distance $d_2$ and encounters the first strip electrode of the third tap $T_3$ which in this example is allocated a weight $W_3 = 4$ and is therefore made up of four strip electrodes spaced by a center-to-centre distance $d_1$ from one another namely by the same distance as the corresponding electrodes in the output track 47. Because the taps $T_1$, $T_2$, $T_3$, are separated by a distance $d_2 = \lambda_c + d_1$, and the electrodes in the output track corresponding thereto are separated by a distance $d_1$, the output signals generated by successive taps will be delayed by $\tau = \lambda_c / v$ where $\lambda_c$ is the acoustic wavelength at the centre frequency $f_c$ of the passband of the coupler, and $v$ is the acoustic wave velocity along the coupler.

It will be apparent that the arrangement described with reference to FIG. 6a is equivalent to a basic form of transversal filter as illustrated in FIG. 6b in which an input signal I is applied to the input of a delay line 48 tapped at regular delay intervals $\tau = \lambda_c / v$, the outputs from the taps $T_1$, $T_2$, $T_3$, being connected via individual weighting circuits $W_1$, $W_2$, $W_3$, and a summation circuit 49 to an output O.

Returning to FIG. 5, the other tap-weighted forward multistrip coupler 45 is identical in construction to that of the coupler 44, however the signal is in this case fed in via the lower track 47 shown in FIG. 6a and the output is generated in the other track 46. This corresponds to the transversal filter arrangement illustrated in FIG. 6c in which the input signal I is distributed via weighting circuits $W_1$, $W_2$, $W_3$, ... to taps $T_1$, $T_2$, $T_3$, ... distributed at uniform delay intervals $\tau = \lambda_c / v$ along a delay line 48, and the output O is taken from the far end of the delay line. This arrangement is basically equivalent to the arrangement of FIG. 6b.

The arrangement shown in FIG. 5 may also be employed in a single-ended configuration at higher signal levels for the purpose of reducing direct electrical coupling between the input and output transducers, and either of the single- or double-ended devices may be arranged to employ the single symmetrical guided mode. In general, it is desirable, especially when using the single symmetrical guided mode, to introduce dummy strip electrodes in the track containing the widely spaced electrodes in the weighted forward multistrip couplers 44 and 45 so that the mean surface loading in that track is made substantially the same as that in the other track of the coupler and to correspond with that in the tracks of the reflective couplers and of the transducers.

It should be noted that if it is desired to reduce the effects of direct electrical coupling still further, the input and output transducers of a device of the kind specified, can be further separated in accordance with the invention by including in the or each propagation path which couples the corresponding ends of the transducers, additional forward multistrip couplers and/or one or more pairs of further reflective multistrip couplers.

I claim:

1. A surface acoustic wave bandpass electrical filter comprising a piezoelectric substrate able to propagate acoustic waves at a surface thereof, input transducing means arranged to launch acoustic wave energy along a propagation track at said surface, output transducing means arranged to receive acoustic wave energy from a further propagation track at said surface which is substantially parallel to but does not overlap said first track, and electrical reflective multistrip coupling means arranged to receive acoustic wave energy from the input transducing means and to relaunch at least part of that energy as acoustic wave energy back towards the output transducing means, said input and output transducers being formed by respective interdigital electrode arrays each comprising parallel strip electrodes which are respectively connected to a corresponding one or other of a pair of bus bars extending along the corresponding sides of the interdigital electrode array, and in which the respective reflective coupling means includes a reflective multistrip coupler comprising a first and second array of mutually parallel conducting strips arranged respectively across an input and an output propagation track, each array including a first set of mutually insulated alternately widely and closely spaced strips, and a second set of electrically interconnected strips arranged so that at least one strip from the second set is situated between substantially every widely spaced pair of strips forming the first set, each strip forming a widely spaced pair in the first set of one array being respectively connected to a corresponding strip forming a closely spaced pair in the first set of the other array and the second set of strips in both arrays being connected together, and at least one forward multistrip coupler included in the surface acoustic wave propagation path and arranged to couple the corresponding ends of the input and output transducers via said reflective multistrip coupler in a manner such that the input and output transducers are spaced apart transversely.

2. A low-loss surface acoustic wave bandpass electrical filter comprising a piezoelectric substrate able to propagate acoustic waves at a surface thereof, input transducing means arranged to launch acoustic wave energy along a propagation track at said surface, output transducing means arranged to receive acoustic wave energy from a further propagation track at said surface which is substantially parallel to but does not overlap said first track, and electical reflective multistrip coupling means respectively arranged to receive acoustic wave energy from each end of the input transducing means and to relaunch at least part of that energy as acoustic wave energy back towards a corresponding end of the output transducing means in a co-operating transductive relationship, said input and output transducers being formed by respective interdigital electrode arrays each comprising parallel strip electrodes which are respectively connected to a corresponding one or other of a pair of bus bars exending along the corresponding sides of the interdigital electrode array, and in which the reflective coupling means are formed by respective reflective multistrip couplers each comprising a first and a second array of mutually parallel conducting strips arranged respectively across an input and an output propagation track, each array including a first set of mutually insulated alternately widely and closely spaced strips, and a second set of electrically interconnected strips arranged so that at least one strip from the second set is situated between substantially every widely spaced pair of strips forming the first set, each strip forming a widely spaced pair in the first set of one array being respectively connected to a corresponding strip forming a closely spaced pair in the first set of the other array and the second set of strips in both arrays being connected together, and at least one forward multistrip coupler included in each surface acoustic wave propagation path and arranged to couple corresponding ends of the input and output transducers via a said reflective multistrip coupler in a manner such that the input and output transducers are spaced apart transversely.

3. A filter as claimed in claim 2, characterised in that a respective forward multistrip coupler is included in the or each said propagation path between the end of each transducer and the corresponding array track of the associated reflective multistrip coupler.

4. A filter as claimed in claim 3, characterised in that the or each surface acoustic wave propagation path which is arranged to couple corresponding ends of the input and output transducers includes an odd plurality of said reflective multistrip couplers.

5. A filter as claimed in claim 2, characterised in that at least one weighted forward multistrip coupler is included in the or each surface acoustic wave propagation path which is arranged to couple corresponding ends of the input and output transducers.

6. A filter as claimed in claim 2, characterised in that at least one of the input and output transducers is in the form of a withdrawal weighted interdigital electrode array.

7. A filter as claimed in claim 2, characterised in that the input and output transducers and the multistrip couplers are arranged to launch, propagate and receive surface acoustic wave energy in the single symmetrical guided surface acoustic wave propagation mode.

8. A filter as claimed in claim 1 wherein a respective forward multistrip coupler is included in a propagation path between the end of each transducer and the corresponding array track of the associated reflective multistrip coupler.

9. A filter as claimed in claim 1 wherein a surface acoustic wave propagation path which is arranged to couple corresponding ends of the input and output transducers includes an odd plurality of said reflective multistrip couplers.

10. A filter as claimed in claim 1 wherein at least one weighted forward multistrip coupler is included in a surface acoustic wave propagation path which is arranged to couple corresponding ends of the input and output transducers.

11. A filter as claimed in claim 1 wherein at least one of the input and output transducers comprises a withdrawal weighted interdigital electrode array.

12. A filter as claimed in claim 1 wherein the input and output transducers and the multistrip couplers are arranged to launch, propagate and receive surface acoustic wave energy in the single symmetrical guided surface acoustic wave propagation mode.

13. A filter as claimed in claim 2 wherein a surface acoustic wave propagation path which is arranged to couple corresponding ends of the input and output transducers includes an odd plurality of said reflective multistrip couplers.

14. A filter as claimed in claim 13 wherein at least one weighted forward multistrip coupler is included in a surface acoustic wave propagation path which is arranged to couple corresponding ends of the input and output transducers.

15. A filter as claimed in claim 9 wherein at least one weighted forward multistrip coupler is included in a surface acoustic wave propagation path which is arranged to couple corresponding ends of the input and output transducers.

* * * * *